US012721075B2

(12) United States Patent
Noji et al.

(10) Patent No.: US 12,721,075 B2
(45) Date of Patent: Aug. 25, 2026

(54) METHOD OF MANUFACTURING SEMICONDUCTOR DEVICE

(71) Applicant: FUJI ELECTRIC CO., LTD., Kawasaki (JP)

(72) Inventors: Noriaki Noji, Nagano-city (JP); Naoko Kodama, Matsumoto-city (JP); Kazuhiro Kitahara, Matsumoto-city (JP); Tatsuya Hashimoto, Azumino-city (JP); Ryota Kataoka, Matsumoto-city (JP); Shunya Hayashida, Matsumoto-city (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 357 days.

(21) Appl. No.: 18/585,576

(22) Filed: Feb. 23, 2024

(65) Prior Publication Data

US 2024/0339332 A1 Oct. 10, 2024

(30) Foreign Application Priority Data

Apr. 6, 2023 (JP) ................................ 2023-062415

(51) Int. Cl.

*H10P 50/00* (2026.01)
*H10D 12/00* (2025.01)
*H10D 12/01* (2025.01)
*H10D 8/00* (2025.01)

(52) U.S. Cl.

CPC ........... *H10P 50/71* (2026.01); *H10D 12/032* (2025.01); *H10D 12/441* (2025.01); *H10D 8/00* (2025.01); *H10D 12/481* (2025.01)

(58) Field of Classification Search

CPC .. H10D 12/031; H10D 12/032; H10D 12/038; H10D 12/411; H10D 12/441; H10D 12/481; H10P 50/71; H10P 76/20; H10P 76/204; H10P 76/2041

See application file for complete search history.

(56) References Cited

U.S. PATENT DOCUMENTS 10,096,533 B2 * 10/2018 Jain ......................... B32B 27/00
2007/0018150 A1 * 1/2007 Nakajima .............. H10K 71/00 257/10
2013/0334511 A1 * 12/2013 Savas ...................... H10F 19/80 257/432

FOREIGN PATENT DOCUMENTS

JP 2016-181646 A 10/2016

* cited by examiner

*Primary Examiner* — Eduardo A Rodela
(74) *Attorney, Agent, or Firm* — Rabin & Berdo, P.C.

(57) ABSTRACT

A method of manufacturing a semiconductor device includes forming a surface structure having a MOS structure in a semiconductor substrate; forming an interlayer insulating film partially covering the surface structure; forming an aluminum alloy film in contact with the surface structure and covering an entire area where the surface structure, including the interlayer insulating film, is formed; forming a resist film covering the surface of the aluminum alloy film so as to have a thickness partially exposing a convex-shaped defect of the aluminum alloy film; patterning the aluminum alloy film using the resist film as a mask; and removing the resist film.

4 Claims, 15 Drawing Sheets

150
10
2
11
9
15
4
3
5
1
12
13
24
6
7
8
14
22 FWD REGION
21 IGBT REGION

METHOD OF MANUFACTURING SEMICONDUCTOR DEVICE

CROSS REFERENCE TO RELATED APPLICATIONS

This application is based upon and claims the benefit of priority of the prior Japanese Patent Application No. 2023-062415, filed on Apr. 6, 2023, the entire contents of which are integrated herein by reference.

BACKGROUND OF THE INVENTION

1. Field of the Invention

Embodiments of the invention relate to method of manufacturing a semiconductor device.

2. Description of the Related Art

According to a known method of manufacturing a semiconductor device, a defect such as step breakage is induced in an inorganic film so that a peeling solution reaches the resist pattern, thereby removing the inorganic film by lift-off (for example, refer to Japanese Laid-Open Patent Publication No. 2016-181646).

SUMMARY OF THE INVENTION

According to an embodiment of the invention, a method of manufacturing a semiconductor device, includes: forming a surface structure having a metal oxide semiconductor (MOS) structure in a semiconductor substrate; forming an interlayer insulating film partially covering the surface structure; forming an aluminum alloy film in contact with the surface structure and covering an entire area where the surface structure, including the interlayer insulating film, is formed; forming a resist film covering a surface of the aluminum alloy film so as to have a thickness partially exposing a convex-shaped defect on the aluminum alloy film; patterning the aluminum alloy film using the resist film as a mask; and removing the resist film.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 5 is a cross-sectional view schematically depicting a state after a resist is applied in the method of manufacturing the semiconductor device according to the embodiment.

FIG. 6 is a cross-sectional view schematically depicting a state after the Al—Si film is etched and the resist is removed in the method of manufacturing the semiconductor device according to the embodiment.

DETAILED DESCRIPTION OF THE INVENTION

Figure 1:
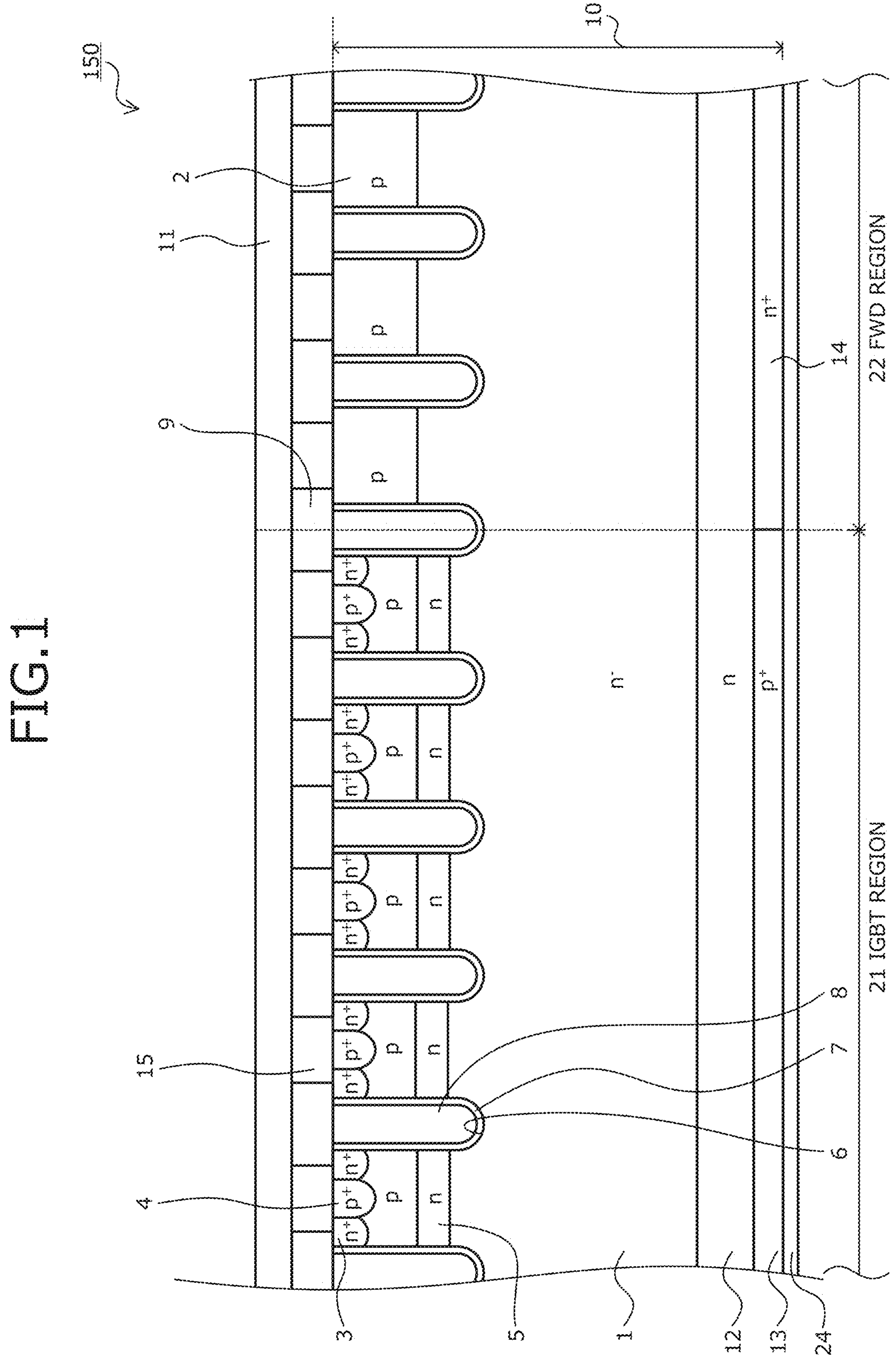
FIG. 1 is a cross-sectional view depicting a structure of a semiconductor device according to an embodiment.

First, problems associated with the conventional techniques are discussed. With the conventional method of manufacturing a semiconductor device, a problem arises in that when foreign matter is present before deposition of an aluminum alloy film such as that containing Al—Si, the foreign matter is integrated into the aluminum alloy film, forms a convex-shaped defect, and is a primary cause of degradation of electrical characteristics during assembly.

Embodiments of a method of manufacturing a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and are not repeatedly described. Further, with consideration of variation in manufacturing, description indicating the same or equal may be within 5%.

First, a method of manufacturing a conventional semiconductor device is described. The method of manufacturing the conventional semiconductor device is described taking reverse conducting insulated gate bipolar transistor (RC-IGBT) as an example. The RC-IGBT incorporates, for example, an IGBT having a trench gate structure and a freewheeling diode (FWD) connected in antiparallel to the IGBT on a single semiconductor substrate (semiconductor chip).

First, an n-type semiconductor substrate (semiconductor wafer) having a thickness that is normally used is prepared. Next, by a general method, a surface device structure such as a metal oxide semiconductor (MOS) gate (an insulated gate formed by a metal, an oxide film, and semiconductor) is formed. For example, at a front surface of an n-type drift region 101 constituting the n-type semiconductor substrate, an n-type accumulation layer 105, a p-type base region 102, trenches 106, $n^+$-type emitter regions 103, $p^+$-type contact regions 104, gate insulating films, gate electrodes 108, etc. are formed (refer to FIG. 14, etc.). Next, for example, an interlayer insulating film 109 such as a borophosphosilicate glass (BPSG) film is deposited (formed) so as to cover the gate electrodes 108.

Next, the interlayer insulating film 109 is patterned, thereby forming contact holes. Next, in the contact holes, contact plugs 115 are formed. Next, for example, by a sputtering method, an aluminum-silicon (Al—Si) alloy film 133 that covers an entire area of the surface of the interlayer insulating film is formed so as to contact the contact plugs 115 in the contact holes.

Next, the Al—Si film 133 is patterned. Next, an annealing treatment is performed to the Al—Si film 133 and front electrodes (emitter electrode and anode electrode) are formed. Next, a passivation film is formed on the front electrodes by, for example, a polyimide film. Next, the n-type semiconductor substrate is ground from a back surface thereof to a position corresponding to a product thickness for use as a semiconductor device, whereby a thickness of the n-type semiconductor substrate is reduced. Next, a back device structure is formed at the ground back surface of the n'-type semiconductor substrate. Next, on the front surface of the semiconductor wafer, the passivation film is formed so as to cover an edge termination region. Next, the passivation film is patterned, thereby exposing the emitter electrode, the anode electrode, and electrode pads, and on the emitter electrode and the anode electrode, Ni—P plating is deposited, and Au plating is deposited on the Ni—P plating, whereby a surface electrode is formed. Next, helium defects constituting a lifetime killer are introduced (formed) in the n-type drift region 101.

Next, at the back surface of the n'-type semiconductor substrate, back electrodes (collector electrode and cathode electrode) are formed. Next, the n-type semiconductor substrate is cut (diced) into individual chips, whereby RC-IGBT chips (semiconductor chips) are completed.

In the method of manufacturing the conventional semiconductor device, when the Al—Si film 133 is patterned, a resist film 131 used as a mask for the wet etching is formed. Here, when foreign matter is present on a surface device (the interlayer insulating film 109, the contact plugs 115), depending on the size of the foreign matter, a convex-shaped defect 136 is formed on the Al—Si film 133 (refer to FIG. 17).

Figure 14:
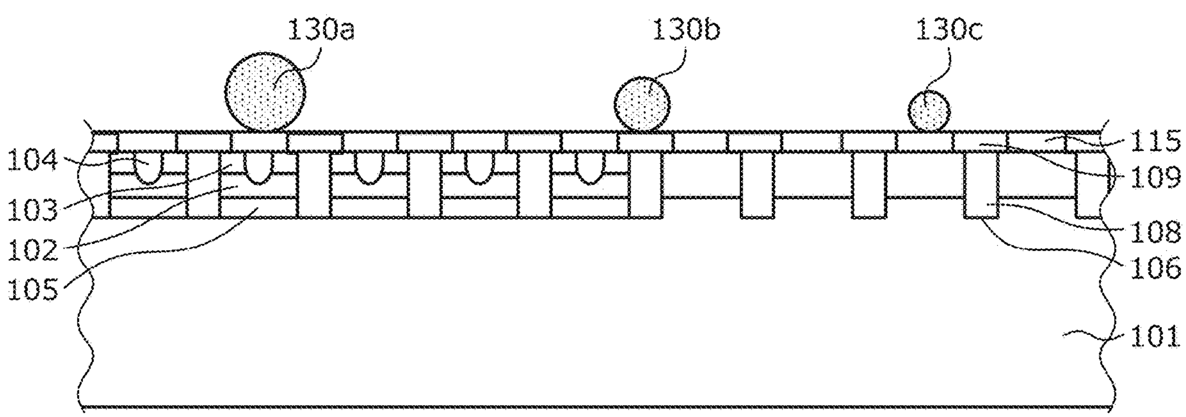
FIG. 14 is a cross-sectional view schematically depicting a state before sputtering of the Al—Si film in the method of manufacturing the conventional semiconductor device.

FIG. 14 is a cross-sectional view schematically depicting a state before deposition of the Al—Si film in the method of manufacturing the conventional semiconductor device. Here, an instance is depicted in which foreign matter **130*a*, foreign matter 130*b*, and foreign matter 130*c* having different respective heights are present on the surface device. The foreign matter 130*a* has a height at least equal to 6 μm while the foreign matter 130*b* has a height of about 5 μm (less than 6 μm). Similar to the foreign matter 130*c***, when the height of foreign matter is small, the foreign matter may be buried in the Al—Si film depending on the shape of the foreign matter.

Figure 15:
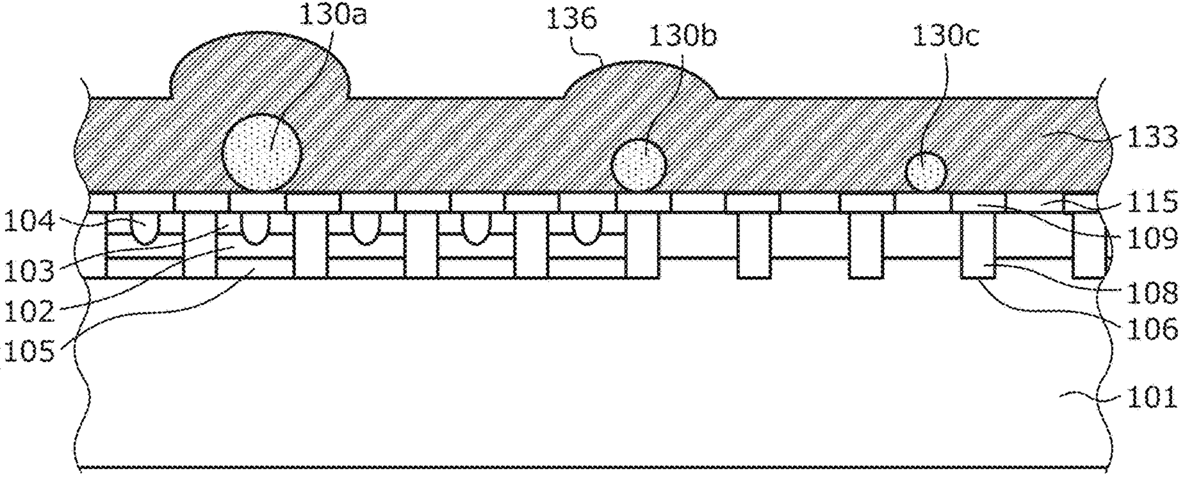
FIG. 15 is a cross-sectional view schematically depicting a state after sputtering of the Al—Si film in the method of manufacturing the conventional semiconductor device.

FIG. 15 is a cross-sectional view schematically depicting a state after sputtering of the Al—Si film in the method of manufacturing the conventional semiconductor device. The Al—Si film 133 has a thickness of about 5 μm and thus, in the case of the foreign matter **130*c*, the foreign matter 130*c* is buried within the Al—Si film 133 while in the cases of the foreign matter 130*a*, 130*b*, the convex-shaped defects 136 are formed in the Al—Si film 133**.

Figure 16:
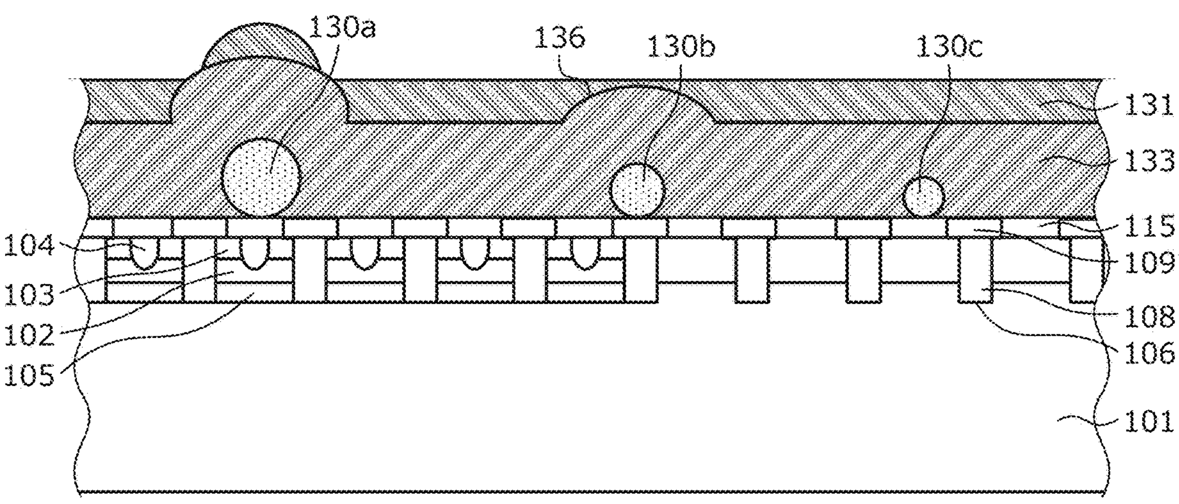
FIG. 16 is a cross-sectional view schematically depicting a state after resist application in the method of manufacturing the conventional semiconductor device.

FIG. 16 is a cross-sectional view schematically depicting a state after resist application in the method of manufacturing the conventional semiconductor device. The resist film 131 is formed having a thickness of 3.2 μm. Thus, in the case of the foreign matter 130*b*, the resist film 131 may cover the convex-shaped defect 136 thereof while in the case of the foreign matter 130*a*, the convex-shaped defect 136 is large and thus, the resist film 131 cannot cover the convex-shaped defect 136.

Figure 17:
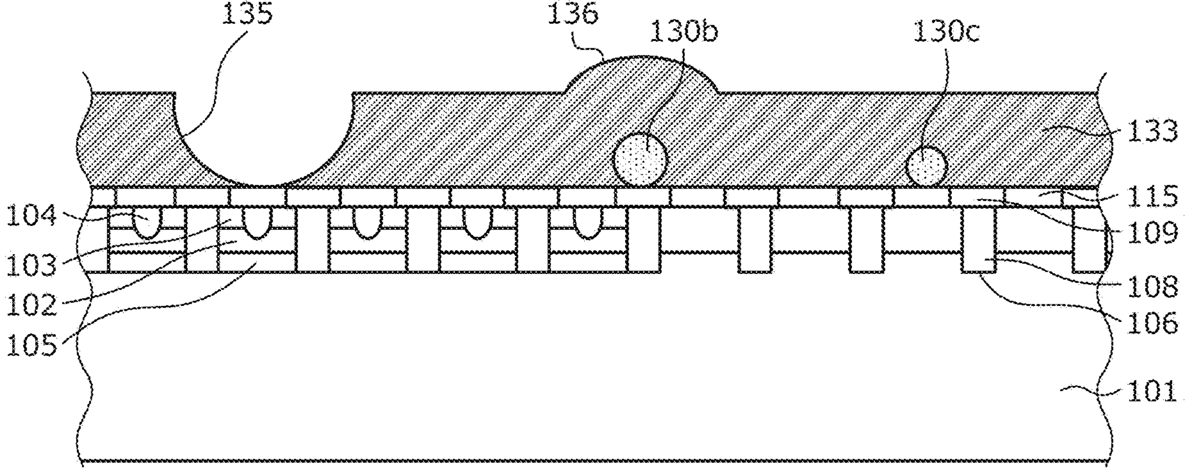
FIG. 17 is a cross-sectional view schematically depicting a state after etching of the Al—Si film and removal of resist in the method of manufacturing the conventional semiconductor device.

FIG. 17 is a cross-sectional view schematically depicting a state after etching of the Al—Si film and removal of resist in the method of manufacturing the conventional semiconductor device. In the case of the foreign matter 130*a*, the resist film 131 cannot cover the convex-shaped defect 136 and thus, when the Al—Si film 133 is etched, the foreign matter 130*a* is etched together with the Al—Si film 133 and a concave-shaped defect 135 is formed. On the other hand, in the case of the foreign matter 130*b*, the convex-shaped defect 136 is covered by the resist film 131 and thus, the Al—Si film 133 is not etched, the Al—Si film 133 and the foreign matter 130*b* remain, and the convex-shaped defect 136 remains.

In an instance in which the concave-shaped defect 135 occurs, there is permeation of plating solution during the plating process and poor electrical characteristics occur during assembly. In the case of the IGBT, while detection by electrical characteristics evaluation is possible, in the case of the RC-IGBT (IGBT+FWD), when a defect occurs in the FWD portion, detection by electrical characteristics is impossible. Further, in an instance in which the convex-shaped defect 136 occurs and the convex-shaped defect 136 is large, screening is necessary because a slit occurs during sputtering and permeation of plating solution occurs. Thus, after formation of the surface electrode pattern, defect screening is performed using an automated visual inspection system.

As described, with regard to defects that should be screened, while the concave-shaped defect 135 and the convex-shaped defect 136 are present, after the surface electrode pattern is formed, the concave-shaped defect 135 is a defect that penetrates to the substrate, thereby exposing the substrate pattern and thus, it is easy to determine whether the concave-shaped defect 135 is a defect to be screened. On the other hand, the convex-shaped defect 136 is only seen as a black point and thus, a problem arises in that detection sensitivity with respect to the convex-shaped defect 136 is low and the convex-shaped defect 136 is a primary factor of poor electrical characteristics.

Figure 18:
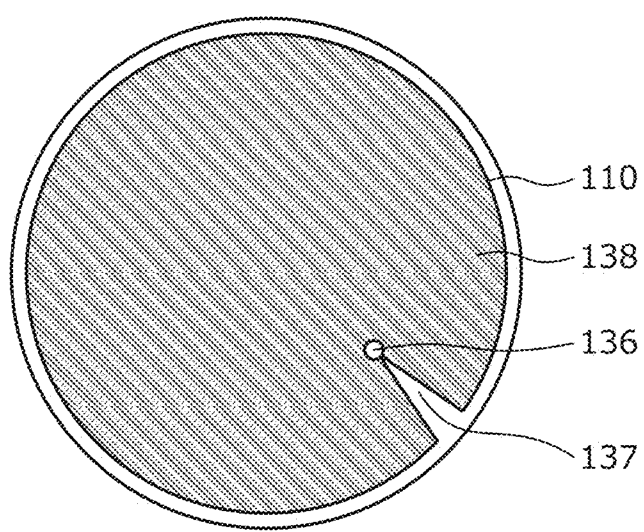
FIG. 18 is a top view schematically depicting a state after resist application in the method of manufacturing the conventional semiconductor device.

A further problem arises in that, when the convex-shaped defect 136 is present, at a subsequent process, the following defects occur. FIG. 18 is a top view schematically depicting a state after resist application in the method of manufacturing the conventional semiconductor device. For example, when helium defects constituting a lifetime killer are introduced, a photoresist film is formed as a mask (masking film). As this time, a semiconductor wafer 110 is placed in a spin coater (coating machine) and a photoresist 138 is applied to (dripped on) the front surface of the semiconductor wafer 110. Further, the semiconductor wafer 110 is rotated, whereby the photoresist spreads in an entire area of the front surface of the semiconductor wafer 110 and the photoresist film 138 is formed in the entire area of the front surface of the semiconductor wafer 110. However, when the convex-shaped defect 136 is present, a problem arises in that an application void 137 having a wedge-like shape occurs with the convex-shaped defect 136 as an origin and thus, the photoresist film 138 cannot be formed in the entire area of the front surface of the semiconductor wafer 110.

Figure 19:
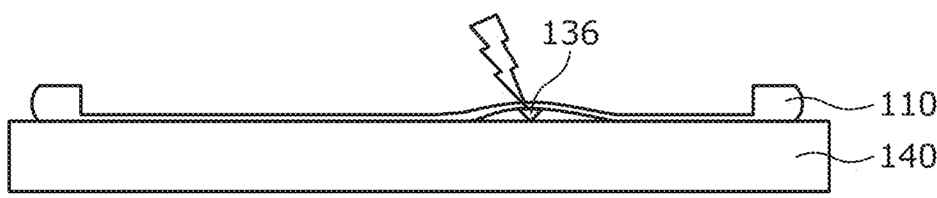
FIG. 19 is a top view schematically depicting a state after attachment to the apparatus stage in the method of manufacturing the conventional semiconductor device.

Further, FIG. 19 is a top view schematically depicting a state after attachment to the apparatus stage in the method of manufacturing the conventional semiconductor device. After the semiconductor wafer 110 is ground from the back side thereof, when the surface side of the semiconductor wafer 110 is placed on an apparatus stage 140, the semiconductor wafer 110 may crack due to the convex-shaped defect 136.

Figure 20:
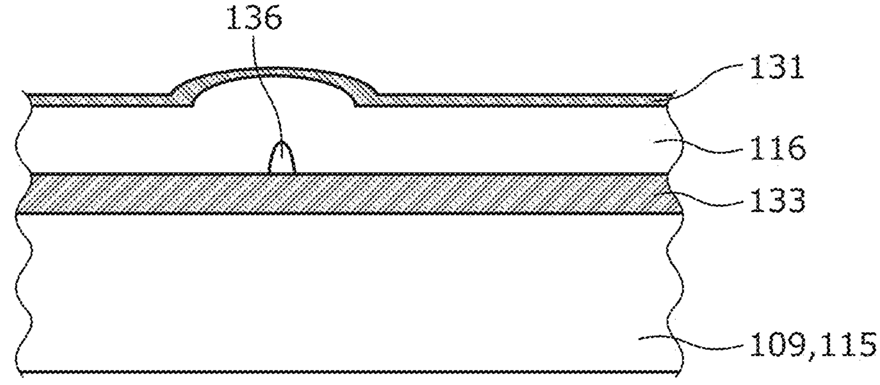
FIG. 20 is a cross-sectional view schematically depicting a state after application of the polyimide film and resist in the method of manufacturing the conventional semiconductor device.
Figure 21:
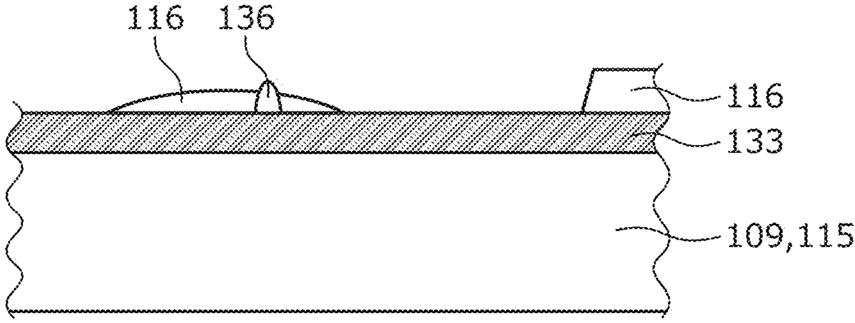
FIG. 21 is a cross-sectional view schematically depicting a state after polyimide film removal in the method of manufacturing the conventional semiconductor device.

Further, FIG. 20 is a cross-sectional view schematically depicting a state after application of the polyimide film and resist in the method of manufacturing the conventional semiconductor device. FIG. 21 is a cross-sectional view schematically depicting a state after polyimide film removal in the method of manufacturing the conventional semiconductor device. Further, a problem arises in that when the convex-shaped defect 136 is present, as depicted in FIG. 20, an application void occurs during application of a polyimide film 116 and the resist film 131 and as depicted in FIG. 21, an instance may occur where a portion of the polyimide film 116 around the convex-shaped defect 136 cannot be removed.

A method of manufacturing a semiconductor device according to an embodiment to solve the problems discussed is described. FIG. 1 is a cross-sectional view depicting a structure of the semiconductor device according to the embodiment. The structure of the semiconductor device according to the embodiment is described taking a trench-type RC-IGBT 150 as an example. The semiconductor device according to the embodiment depicted in FIG. 1 is the RC-IGBT 150 in which an IGBT with a trench gate structure and a diode connected in antiparallel to the IGBT are integrated on a single semiconductor substrate (semiconductor chip). While the RC-IGBT 150 has an active region through which current flows during an on-state and an edge termination region surrounding a periphery of the active region, in FIG. 1, only the active region is depicted.

In the RC-IGBT 150, an IGBT region (transistor portion) 21 constituting an operating region of the IGBT and a diode region (diode portion, FWD region) 22 constituting an operating region of the diode 2 are provided in parallel on the single semiconductor substrate having the active region.

In a semiconductor wafer 10, in the active region, an n-type accumulation layer 5 may be provided in a surface layer of an n'-type drift region 1, at a front surface of the n-type drift region 1. The n-type accumulation layer 5 is a so-called charge storage layer (CSL) that reduces carrier spreading resistance. On the n-type accumulation layer 5, a p-type base region 2 is provided in the IGBT region 21 and the FWD region 22. The p-type base region 2 functions as a p-type anode region in the FWD region 22. Trenches 6 that penetrate through the p-type base region 2 and reach the $n^-$-type drift region 1 are provided. The trenches 6 are provided in the IGBT region 21 and the FWD region 22, and in the IGBT region 21, $n^+$-type emitter regions 3 are provided sandwiching each of the trenches 6. The trenches 6 are disposed at a predetermined interval so as to have, in a plan view, for example, striped layout and the trenches 6 divide the p-type base region 2 into multiple regions (mesa portions). In the trenches 6, gate insulating films 7 are provided, respectively, along inner walls of the trenches 6 and gate electrodes 8 are provided on the gate insulating films 7, respectively.

In the IGBT region 21, in the p-type base region 2, the $n^+$-type emitter regions 3 are selectively provided in the mesa portions, respectively. The $n^+$-type emitter regions 3 face the gate electrodes 8 with the gate insulating films 7 provided at the inner walls of the trenches 6 intervening therebetween. In the mesa portions, $p^+$-type contact regions 4 may be provided. In this case, the $n^+$-type emitter regions 3 and the $p^+$-type contact regions 4 are in contact with one another. In the FWD region 22, the p-type base region 2 is free of the $n^+$-type emitter regions 3 and the $p^+$-type contact regions 4. A front electrode 11 is in contact with the $n^+$-type emitter regions 3 via contact holes and is electrically insulated from the gate electrodes 8 by an interlayer insulating film 9. In the $n^+$-type emitter regions 3, openings may be selectively provided; and in the openings, the front electrode 11 and the p-type base region 2 may be electrically connected. In an instance in which the $p^+$-type contact regions 4 are provided, the front electrode 11 and the $p^+$-type contact regions 4 may be electrically connected. The front electrode 11, functions as an emitter electrode in the IGBT region 21 and functions as an anode electrode in the FWD region 22. Further, contact plugs 15 are embedded in the contact holes and the emitter electrode may be connected to the $n^+$-type emitter regions 3 and the $p^+$-type contact regions 4 via a barrier metal (not depicted) and the contact plugs 15. The front electrode 11 may be constituted by an Al film or an aluminum alloy film containing Al—Si; the contact plugs 15 may contain tungsten (W); and the barrier metal may be constituted by a two-layer film containing titanium (Ti) and titanium nitride (TiN).

In the n'-type drift region 1, near a back surface thereof facing a back electrode 24, an n-type field stop (FS) layer 12 is provided. The n-type FS layer 12 has a function of suppressing the spreading of a depletion layer from pn junctions between the p-type base region 2 and the n'-type drift region 1, in a direction to a later-described $p^+$-type collector region 13 during an off-state.

Further, in the n-type drift region 1, in the FWD region 22, at a position closer to the front surface of the n'-type drift region 1 than is the n-type FS layer 12, a lifetime control region (not depicted) formed by lattice defects such as vacancies (V) constituting lifetime killers may be provided by helium (He) irradiation.

In the n-type drift region 1, the $p^+$-type collector region 13 is provided in the IGBT region 21 at a position closer to the back surface of the n-type drift region 1 than is the n-type FS layer 12 and an $n^+$-type cathode region 14 is provided in the FWD region 22. The $n^+$-type cathode region 14 is adjacent to the $p^+$-type collector region 13. The back electrode 24 is provided on the surfaces of the $p^+$-type collector region 13 and the $n^+$-type cathode region 14. The back electrode 24 functions as a collector electrode in the IGBT region 21 and functions as a cathode electrode in the FWD region 22.

Figure 2:
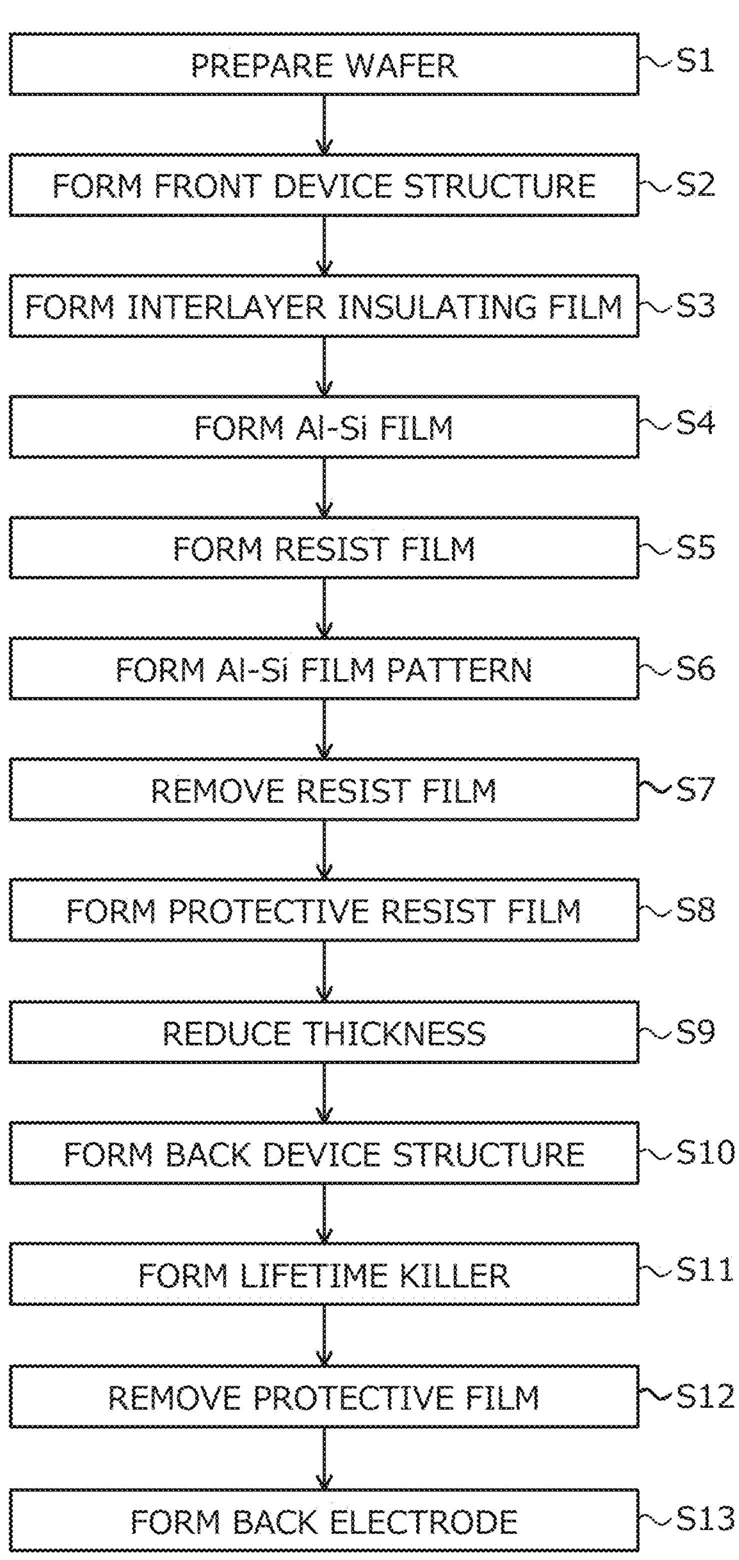
FIG. 2 is a flowchart depicting a method of manufacturing the semiconductor device according to the embodiment.

Next, a method of manufacturing the semiconductor device according to the embodiment is described. FIG. 2 is a flowchart depicting the method of manufacturing the semiconductor device according to the embodiment. First, the semiconductor wafer 10 of an n'-type and constituting the n'-type drift region 1 is prepared (step S1). A material of the semiconductor wafer 10 may be silicon (Si) or may be silicon carbide (SiC). Hereinafter, an instance in which the semiconductor wafer 10 is a silicon wafer is described as an example.

Next, a process including photolithography and ion implantation as one set is repeatedly performed under different conditions, thereby forming in the front side of the semiconductor wafer 10, a surface device structure that includes a MOS structure (step S2: first process). For example, first, the p-type base region 2, the $n^+$-type emitter regions 3, and the $p^+$-type contact regions 4 of the IGBT are formed. The p-type base region 2 is formed at the entire surface of the active region, in the IGBT region 21 and the FWD region 22. The p-type base region 2 further serves as a p-type anode region in the FWD region 22. The $n^+$-type emitter regions 3 and the $p^+$-type contact regions 4 are selectively formed in the p-type base region 2, in the IGBT region 21.

A portion of the semiconductor wafer 10 excluding the p-type base region 2, the later-described n-type FS layer 12, the $p^+$-type collector region 13, and the $n^+$-type cathode region 14 constitutes the n'-type drift region 1. In the IGBT region 21, the n-type accumulation layer 5 may be formed between the n'-type drift region 1 and the p-type base region 2. The n-type accumulation layer 5 becomes a barrier with respect to minority carriers (holes) of the n'-type drift region 1 when the IGBT turns on and the n-type accumulation layer 5 has a function of accumulating minority carriers in the n-type drift region 1.

Next, the front surface of the semiconductor wafer 10 is thermally oxidized, thereby forming a field oxide film covering the semiconductor wafer 10, in the edge termination region. Next, by photolithography and etching, the trenches 6 penetrating through the $n^+$-type emitter regions 3, the p-type base region 2, and the n-type accumulation layer 5 and reaching the n'-type drift region 1 are formed in the IGBT region 21. The trenches 6, when viewed from the front side of the semiconductor wafer 10, for example, are disposed in a striped layout extending in a direction (direction of view in FIG. 1) orthogonal to a direction (horizontal direction in FIG. 1) in which the IGBT region 21 and the FWD region 22 are arranged.

Further, the trenches 6 may be provided in the FWD region 22 in a same layout as that in the IGBT region 21. In the FWD region 22, the trenches 6 penetrate through the p-type base region 2 (p-type anode region) and reach the n-type drift region 1. Next, for example, by thermal oxidation, the gate insulating films 7 are formed along inner walls of the trenches 6. Next, on the front surface of the semiconductor wafer 10, a polysilicon (poly-Si) layer is formed so as to be embedded in the trenches 6. Next, the polysilicon layer, for example, is etched back and portions thereof constituting the gate electrodes 8 are left in the trenches 6.

The MOS gates of the trench gate structure are configured by the p-type base region 2, the $n^+$-type emitter regions 3, the $p^+$-type contact regions 4, the trenches 6, the gate insulating films 7, and the gate electrodes 8. The $n^+$-type emitter regions 3, the $p^+$-type contact regions 4, and the n-type accumulation layer 5 may be formed after the gate electrodes 8 are formed. The $n^+$-type emitter regions 3 suffice to be disposed in at least one mesa region between any adjacent two of the trenches 6 and mesa regions free of the $n^+$-type emitter regions 3 may be present. Further, the $n^+$-type emitter regions 3 may be selectively disposed at a predetermined interval in the direction in which the trenches 6 extend in the striped layout.

As described, after the surface device structure is formed, the interlayer insulating film 9 constituted by, for example, a BPSG film is formed on the front surface of the semiconductor wafer 10 so as to cover the gate electrodes 8 (step S3: second process). Next, the interlayer insulating film 9 is patterned, thereby forming multiple contact holes penetrating through the interlayer insulating film 9 in a depth direction. The depth direction is a direction from the front surface to the back surface of the semiconductor wafer 10. In the contact holes in the IGBT region 2, the $n^+$-type emitter regions 3 and the $p^+$-type contact regions 4 are exposed. In the contact holes in the FWD region 22, the p-type base region 2 is exposed. In the contact holes, the contact plugs 15 may be formed via a barrier metal (not depicted).

Next, on the interlayer insulating film 9, an Al—Si film 33 is deposited so as to be embedded in the contact holes (step S4: third process). For example, by a sputtering method, an aluminum alloy film, for example, the Al—Si film 33, is formed so as to cover the entire surface of the interlayer insulating film 9 and be in contact with the contact plugs 15 in the contact holes. Next, a resist film 31 covering the surface of the Al—Si film 33 and to be used as a wet-etching mask to pattern the Al—Si film 33 is formed (step S5: fourth process). Next, the resist film 31 is used as a mask and the Al—Si film 33 is patterned (step S6: fifth process). Next, the patterned Al—Si film 33 is annealed, whereby the front electrode 11 is formed. Next, the resist film 31 is removed (step S7: sixth process). The front electrode 11 is electrically connected to the p-type base region 2, the $n^+$-type emitter regions 3, and the $p^+$-type contact regions 4 and functions as the emitter electrode in the IGBT region 21. Further, the front electrode 11 is electrically connected to the p-type base region 2 and functions as the anode electrode in the FWD region 22. The front electrode 11 may be electrically connected to the p-type base region 2 in the mesa regions free of the $n^+$-type emitter regions 3.

Figure 4:
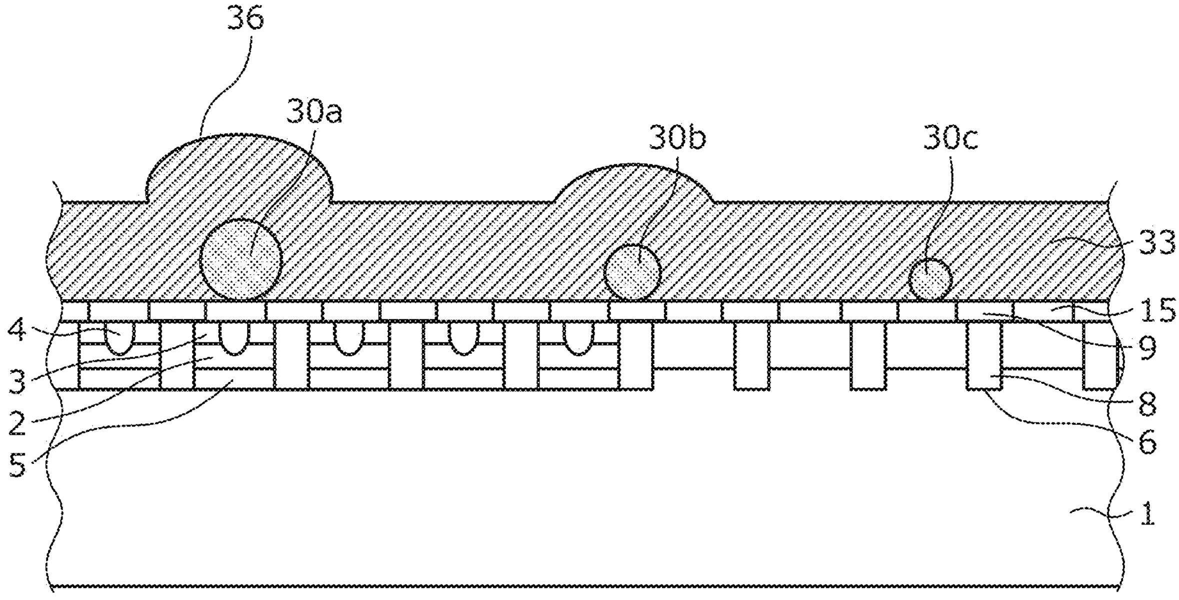
FIG. 4 is a cross-sectional view schematically depicting a state after sputtering of the Al—Si film in method of manufacturing the semiconductor device according to the embodiment.

In the embodiment, the resist film 31 is thinner than the conventional thickness of 3.2 μm and is deposited having a thickness that partially exposes a convex-shaped defect 36 on the Al—Si film 33. Partial exposure means, for example, as depicted in FIG. 4, an instance in which an apex of the convex-shaped defect 36 is not covered or as depicted in FIG. 16, an instance in which a side portion of the convex-shaped defect 136 is not covered. The thickness partially exposing the convex-shaped defect 36 is in a range of, for example, 1.6 μm to 3.1 μm. Thus, by reducing the thickness, as described hereinafter, the convex-shaped defect 36 formed in an instance in which foreign matter is present on the surface device structure may be converted into a concave-shaped defect 35.

Figure 3:
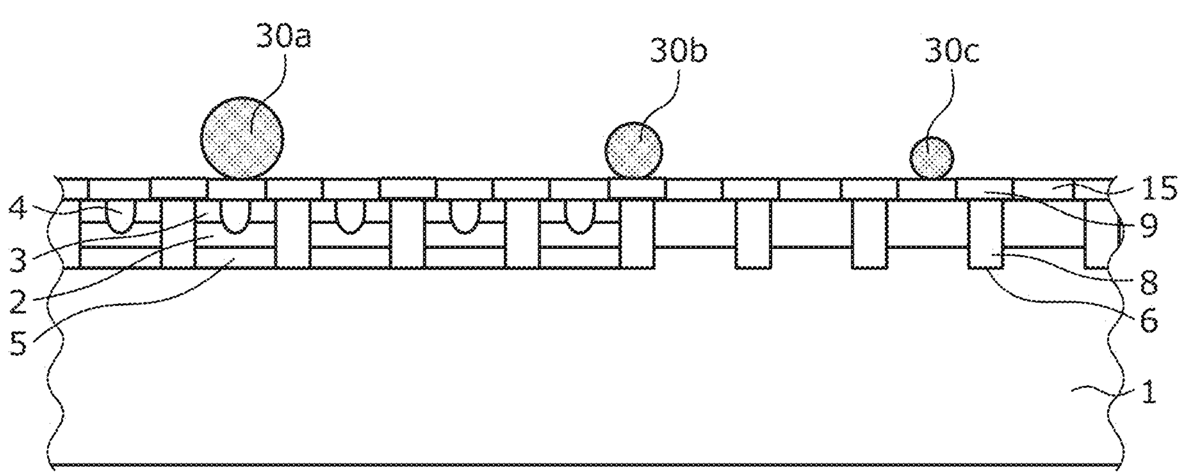
FIG. 3 is a cross-sectional view schematically depicting a state before an Al—Si film is formed in the method of manufacturing the semiconductor device according to the embodiment.

FIG. 3 is a cross-sectional view schematically depicting a state before the Al—Si film is formed in the method of manufacturing the semiconductor device according to the embodiment. Here, an instance is depicted in which foreign matter 30*a*, foreign matter 30*b*, and foreign matter 30*c* respectively having different heights are on the surface device (the contact plugs 15 and the interlayer insulating film 9). The foreign matter 30*a* has a height of at least 6 μm and the foreign matter 30*b* has a height of about 5 μm (less than 6 μm). When the height of foreign matter is small, the foreign matter may be buried in the Al—Si film depending on the shape, similarly to the foreign matter 30*c*.

FIG. 4 is a cross-sectional view schematically depicting a state after the sputtering of the Al—Si film in method of manufacturing the semiconductor device according to the embodiment. The Al—Si film 33 has a thickness of about 5 μm and thus, while in an instance of the foreign matter 30*c*, the foreign matter 30*c* is buried in the Al—Si film 33, in instances of the foreign matter 30*a*, 30*b*, the convex-shaped defects 36 are formed in the Al—Si film 33. The convex-shaped defect 36 has a height that is related to the heights of the foreign matter 30*a*, 30*b* and the greater are the heights of the foreign matter 30*a*, 30*b*, the greater are the heights of the convex-shaped defects 36.

Figures 5, 6:
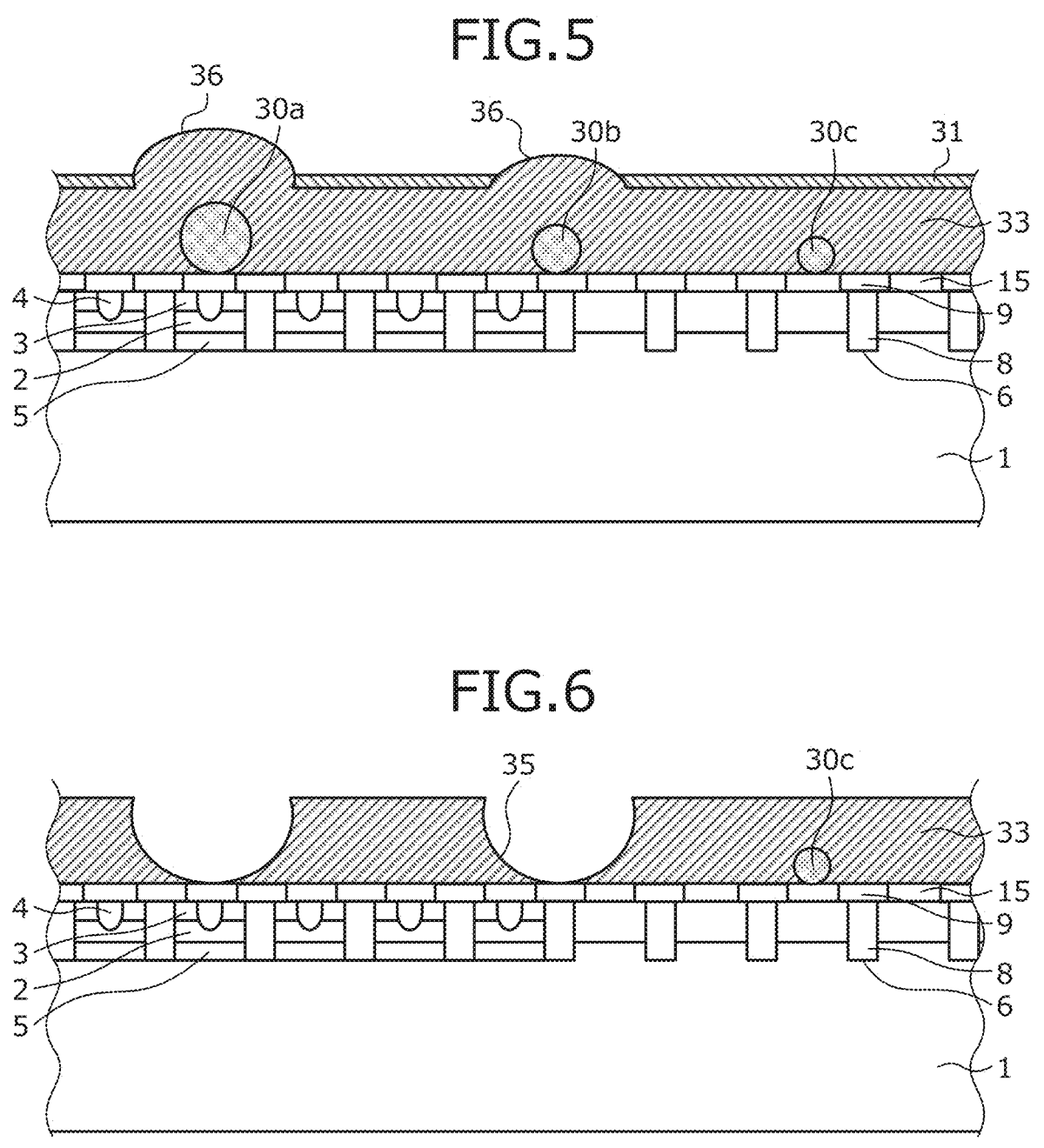

FIG. 5 is a cross-sectional view schematically depicting a state after a resist is applied in the method of manufacturing the semiconductor device according to the embodiment. The resist film 31 is formed having a thickness in a range of 1.6 μm to 3.1 μm. Thus, in instances of the foreign matter 30*a* and 30*b*, the resist film 31 has step breakage, the convex-shaped defects 36 cannot be covered, and a portion of each of the convex-shaped defects 36 is exposed.

FIG. 6 is a cross-sectional view schematically depicting a state after the Al—Si film is etched and the resist is removed in the method of manufacturing the semiconductor device according to the embodiment. In an instance of the foreign matter 30*a* and 30*b*, the convex-shaped defects 36 cannot be covered and portions of the convex-shaped defects 36 are exposed and thus, when the Al—Si film 33 is etched, the foreign matter 30*a* and 30*b* are etched together with the Al—Si film 33, whereby the concave-shaped defects 35 are formed.

As described, in an instance of the foreign matter 30*a*, similarly to that conventionally, the concave-shaped defect 35 is formed and conventionally, even in an instance in which the foreign matter 30*b* forms the convex-shaped defect 36, the thickness of the resist film 31 is reduced, whereby the concave-shaped defects 35 are formed. The convex-shaped defects 36 are formed into the concave-shaped defects 35, whereby a difference in brightness with the substrate increases, the detection sensitivity during defect inspection is enhanced, and the throughput of the inspection process may be improved. Further, the width of a defect increases due to the etching of the Al—Si film 33 and thus, the widths of the concave-shaped defects 35 are greater than those of the convex-shaped defects 36 and the detection sensitivity is enhanced.

Figure 7A:
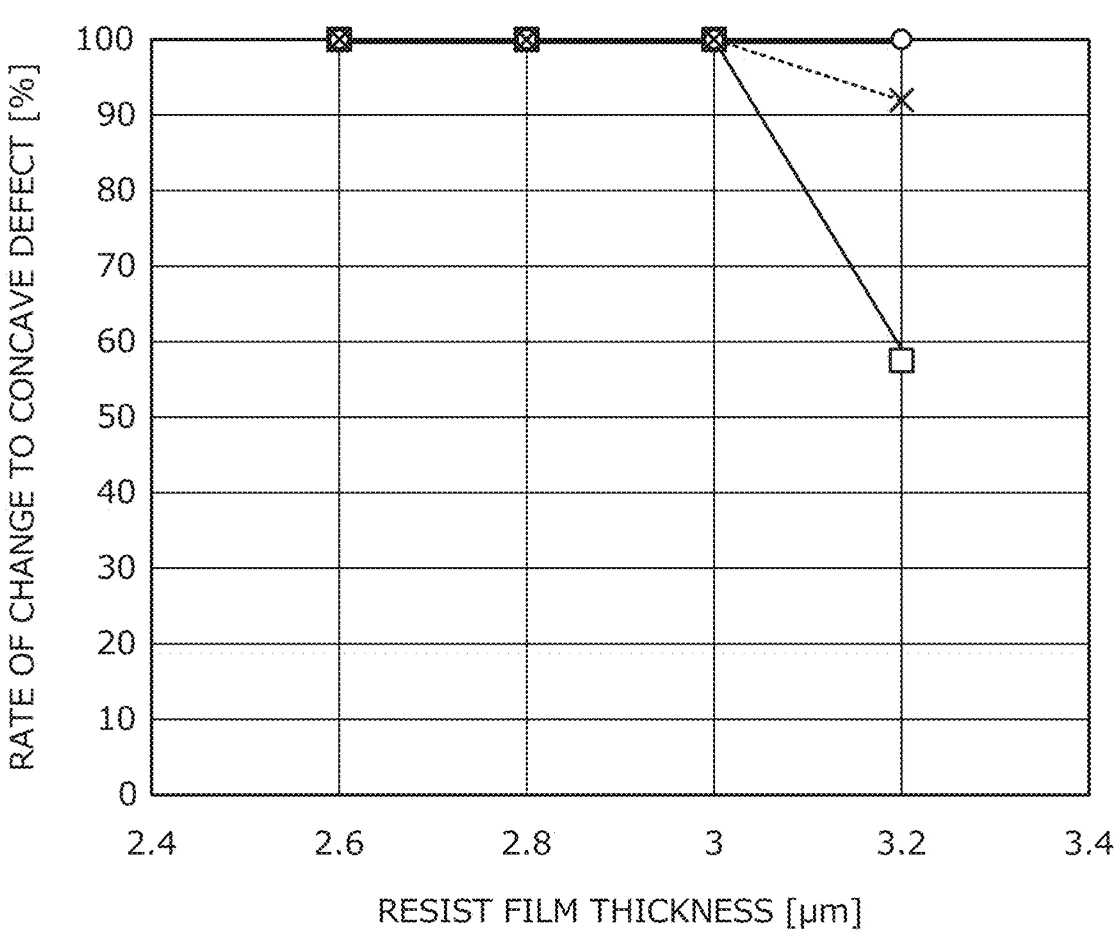
FIG. 7A is a graph depicting resist film thickness and rate of change to concave-shaped defect for an instance in which a height of a convex-shaped defect is 6 μm in the method of manufacturing the semiconductor device according to the embodiment.
Figure 7A:
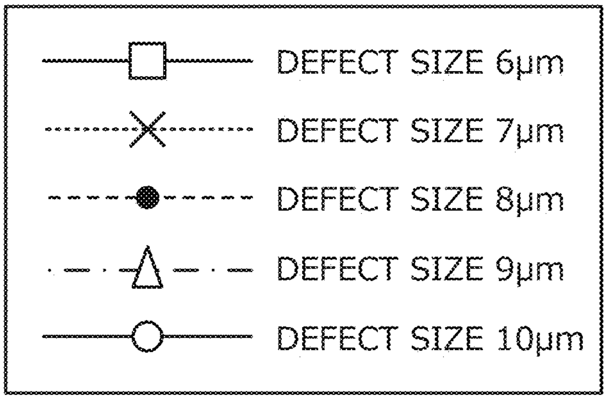
Figure 7B:
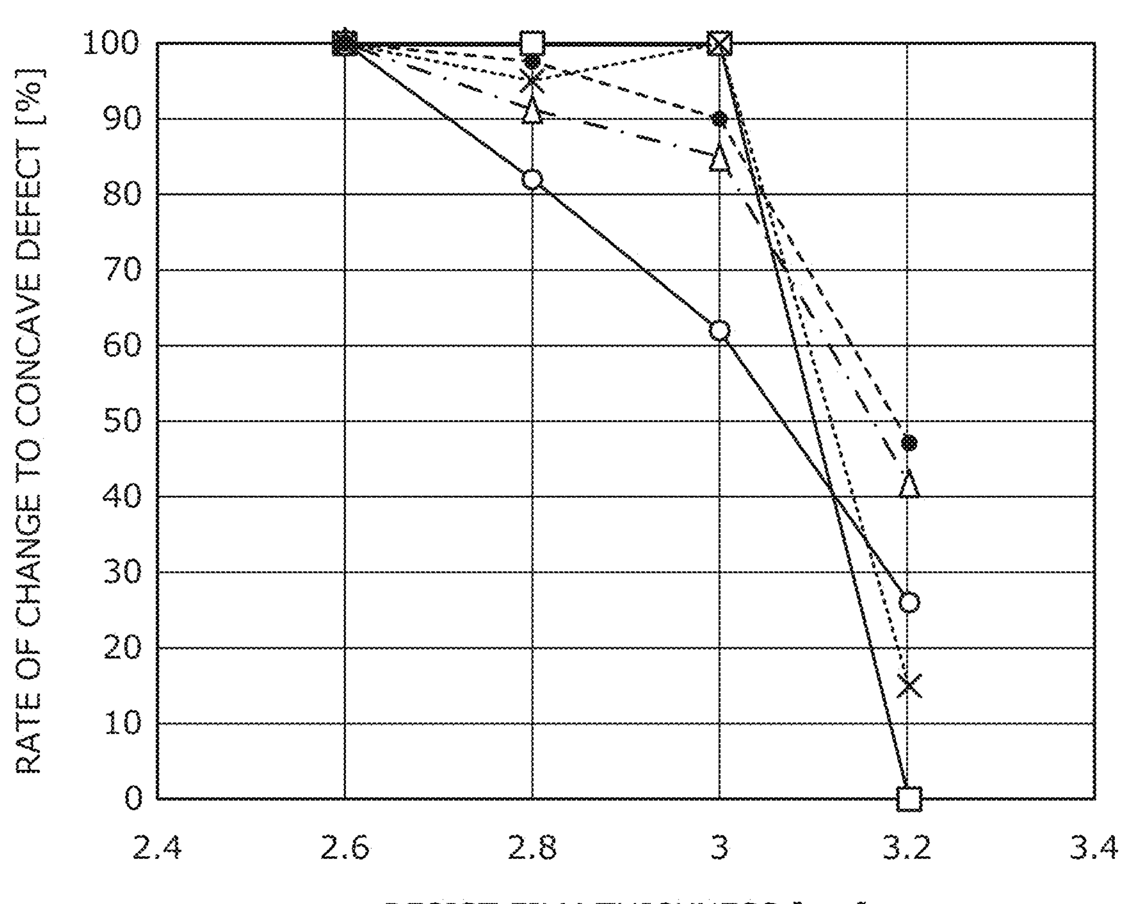
FIG. 7B is a graph depicting the resist film thickness and rate of change to concave-shaped defect for an instance in which the height of the convex-shaped defect is 5 μm in the method of manufacturing the semiconductor device according to the embodiment.
Figure 7B:
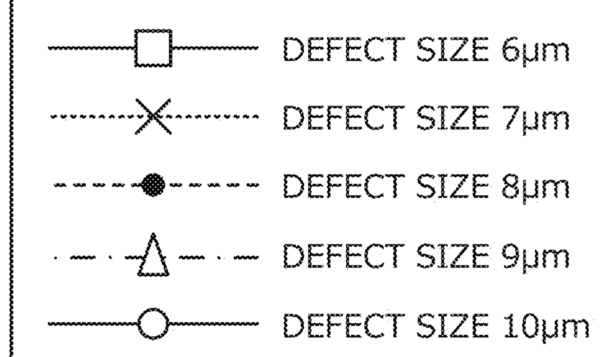
Figure 7C:
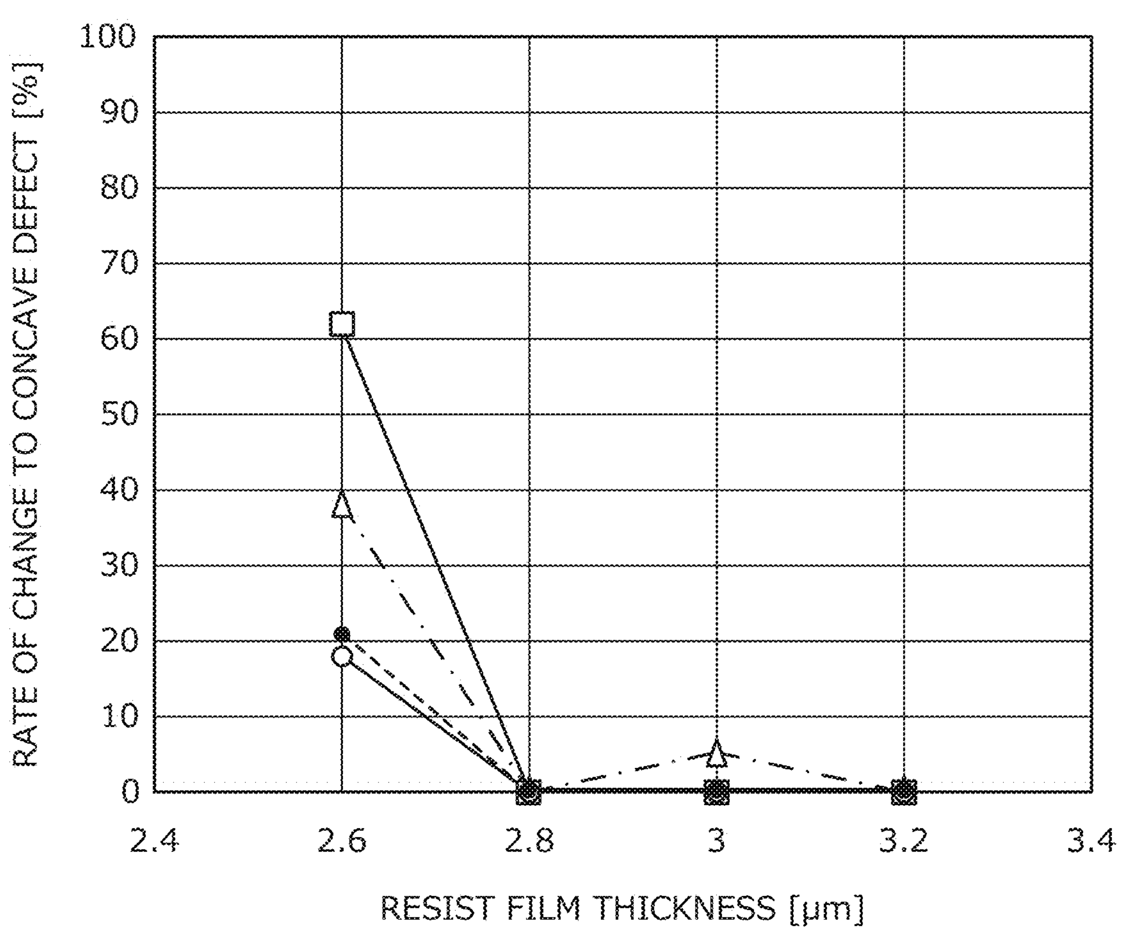
FIG. 7C is a graph depicting the resist film thickness and rate of change to concave-shaped defect for an instance in which the height of the convex-shaped defect is 4 μm in the method of manufacturing the semiconductor device according to the embodiment.
Figure 7C:
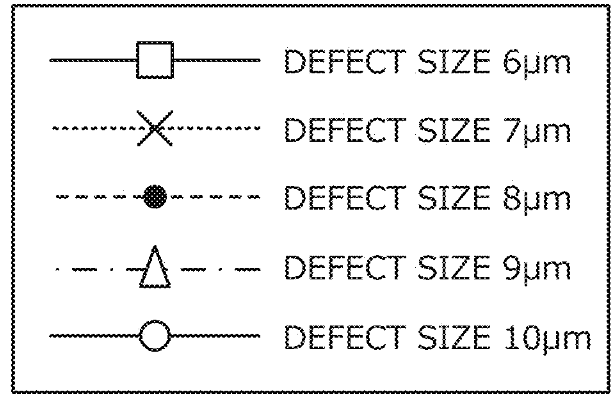

FIG. 7A is a graph depicting resist film thickness and rate of change to concave-shaped defect for an instance in which the height of the convex-shaped defect is 6 μm in the method of manufacturing the semiconductor device according to the embodiment. FIG. 7B is a graph depicting resist film thickness and rate of change to concave-shaped defect for an instance in which the height of the convex-shaped defect is 5 μm in the method of manufacturing the semiconductor device according to the embodiment. FIG. 7C is a graph depicting resist film thickness and rate of change to concave-shaped defect for an instance in which the height of the convex-shaped defect is 4 μm in the method of manufacturing the semiconductor device according to the embodiment. In FIGS. 7A to 7C, a horizontal axis indicates thickness of the resist film 31 in units of μm. A vertical axis indicates rate of change to concave-shaped defect in units of percentage (%). The rate of change to concave-shaped defect is the percentage of the convex-shaped defects 36 that are present after sputtering of the Al—Si film 33 (refer to FIG. 4) and are converted into the concave-shaped defect 35 after the etching of the Al—Si film 33 and removal of the resist (refer to FIG. 6). FIGS. 7A to 7C depict an instance in which sizes of the convex-shaped defects 36 in a lateral direction are in a range of 6 μm to 10 μm.

FIG. 7A depicts an instance in which, similar to the foreign matter 30*a*, the height of the foreign matter is large and as depicted in FIG. 7A, when the resist film 31 has a thickness in a range of 1.6 μm to 3.1 μm, the resist film 31 cannot cover a portion of the convex-shaped defect 36 and the convex-shaped defect 36 is converted into the concave-shaped defect 35.

FIG. 7B depicts an instance in which, similar to the foreign matter 30*b*, the height of the foreign matter is about 5 μm and as depicted in FIG. 7B, when the resist film 31 has the conventional width of 3.2 μm, the resist film 31 covers the convex-shaped defects 36 thereof and thus, the percentage of the convex-shaped defects 36 not converted into the concave-shaped defect 35 is high. On the other hand, in an instance in which the resist film 31 of the embodiment has a thickness in a range of 1.6 μm to 3.1 μm, the resist film 31 cannot completely cover the convex-shaped defects 36 and thus, the percentage of the convex-shaped defects 36 converted into the concave-shaped defect 35 is high.

FIG. 7C is an instance in which, similar to the foreign matter 30*c*, the height of the foreign matter is low and thus, the foreign matter does not generate the convex-shaped defect 36 and the percentage of the convex-shaped defects 36 converted into the concave-shaped defect 35 decreases.

Figure 8:
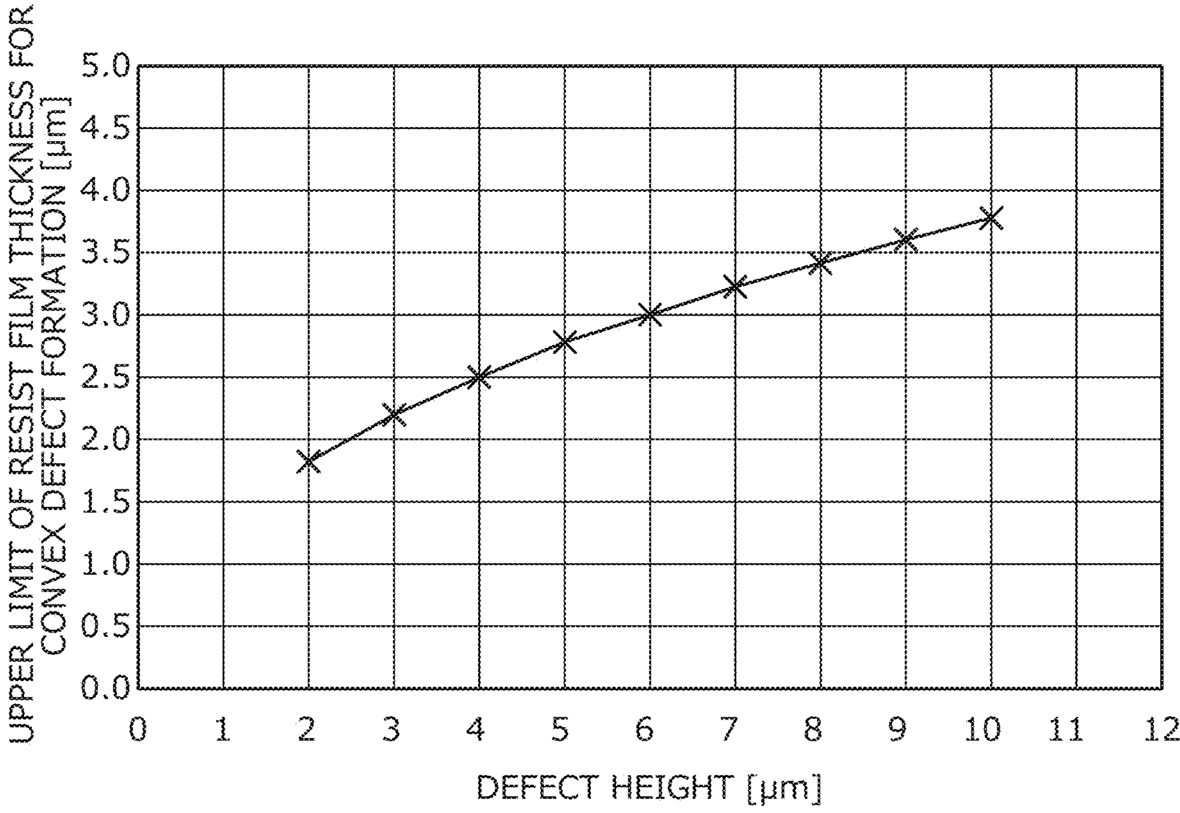
FIG. 8 is a graph depicting a relationship between the height of the convex-shaped defect and the resist film thickness in the method of manufacturing the semiconductor device according to the embodiment.

FIG. 8 is a graph depicting a relationship between the height of the convex-shaped defect and the resist film thickness in the method of manufacturing the semiconductor device according to the embodiment. In FIG. 8, a horizontal axis indicates the height of the convex-shaped defect 36 in units of μm. A vertical axis indicates, in units of μm, an upper limit of the thickness of the resist film for conversion to the concave-shaped defect 35. As depicted in FIG. 8, the thickness of the resist film 31 is not more than 3.1 μm and thus, the convex-shaped defects 36 of 7 μm may be converted into the concave-shaped defect 35. Further, to convert the conventional convex-shaped defects 36 of about 5 μm into the concave-shaped defect 35, the thickness of the resist film 31 is optimally in a range of 2.7 μm to 2.9 μm.

Figure 9A:
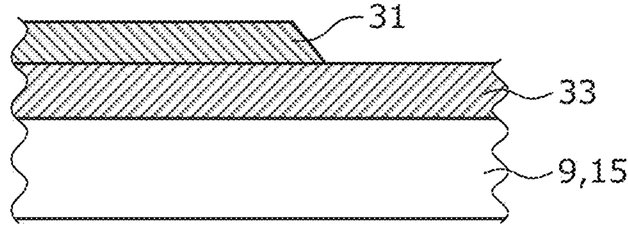
FIG. 9A is a cross-sectional view schematically depicting a state after patterning of the Al—Si film in an instance in which the resist film thickness is sufficient in the method of manufacturing the semiconductor device according to the embodiment.
Figure 9B:
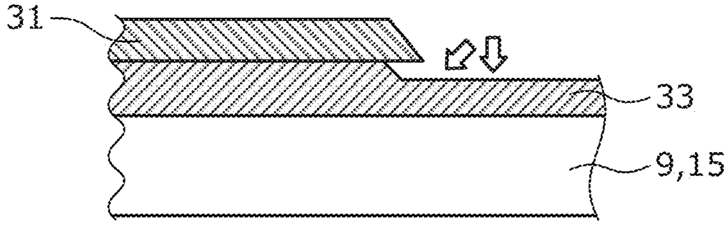
FIG. 9B is a cross-sectional view schematically depicting a state during etching of the Al—Si film in an instance in which the resist film thickness is sufficient in the method of manufacturing the semiconductor device according to the embodiment.
Figure 9C:
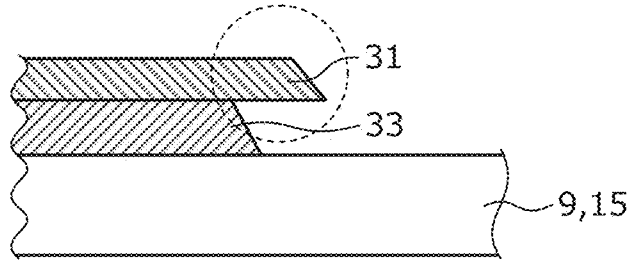
FIG. 9C is a cross-sectional view schematically depicting a state after etching of the Al—Si film in an instance in which the resist film thickness is sufficient in the method of manufacturing the semiconductor device according to the embodiment.

FIG. 9A is a cross-sectional view schematically depicting a state after patterning of the Al—Si film in an instance in which the resist film thickness is sufficient in the method of manufacturing the semiconductor device according to the embodiment. FIG. 9B is a cross-sectional view schematically depicting a state during etching of the Al—Si film in an instance in which the resist film thickness is sufficient in the method of manufacturing the semiconductor device according to the embodiment. FIG. 9C is a cross-sectional view schematically depicting a state after etching of the Al—Si film in an instance in which the resist film thickness is sufficient in the method of manufacturing the semiconductor device according to the embodiment.

Figure 10A:
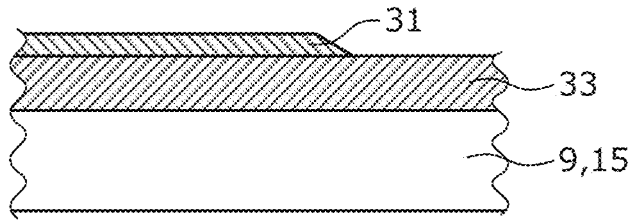
FIG. 10A is a cross-sectional view schematically depicting a state after patterning of the Al—Si film in an instance in which the resist film thickness is thin in the method of manufacturing the semiconductor device according to the embodiment.
Figure 10B:
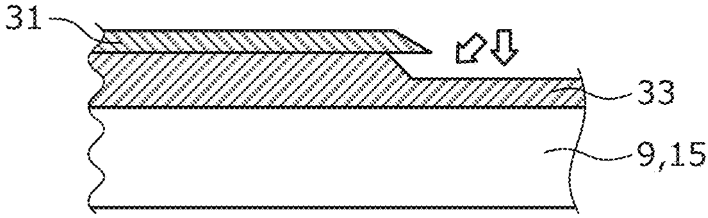
FIG. 10B is a cross-sectional view schematically depicting a state during etching of the Al—Si film in an instance in which the resist film thickness is thin in the method of manufacturing the semiconductor device according to the embodiment.
Figure 10C:
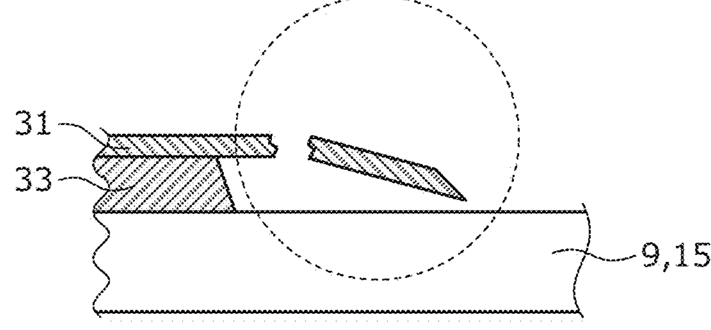
FIG. 10C is a cross-sectional view schematically depicting a state after etching of the Al—Si film in an instance in which the resist film thickness is thin in the method of manufacturing the semiconductor device according to the embodiment.

On the other hand, FIG. 10A is a cross-sectional view schematically depicting a state after patterning of the Al—Si film in an instance in which the resist film thickness is thin in the method of manufacturing the semiconductor device according to the embodiment. FIG. 10B is a cross-sectional view schematically depicting a state during etching of the Al—Si film in an instance in which the resist film thickness is thin in the method of manufacturing the semiconductor device according to the embodiment. FIG. 10C is a cross-sectional view schematically depicting a state after etching of the Al—Si film in an instance in which the resist film thickness is thin in the method of manufacturing the semiconductor device according to the embodiment.

When the Al—Si film 33 is etched, the Al—Si film 33 beneath the resist film 31 is etched at the ends of the resist film 31, as indicated by arrows in FIGS. 9B and 10B. Therefore, at the ends of the resist film 31, as indicated by dotted circles in FIGS. 9C and 10C, an overhang is formed. Here, while the overhang does not break when the resist film 31 has a sufficient thickness as depicted in FIG. 9C, when the resist film 31 has an insufficient thickness, the overhang breaks as depicted in FIG. 10. Thus, the resist film 31 has to be of a thickness that maintains the strength of the overhang formed by the wet etching, to be resistant to breakage and, for example, the thickness of the resist film 31 is set to be at least 1.6 μm so that breakage of the overhang may be prevented. Further, a lower limit of the thickness of the resist film 31 for no overhang breakage is 1.6 μm regardless of the wafer diameter of the semiconductor wafer 10.

Figure 11:
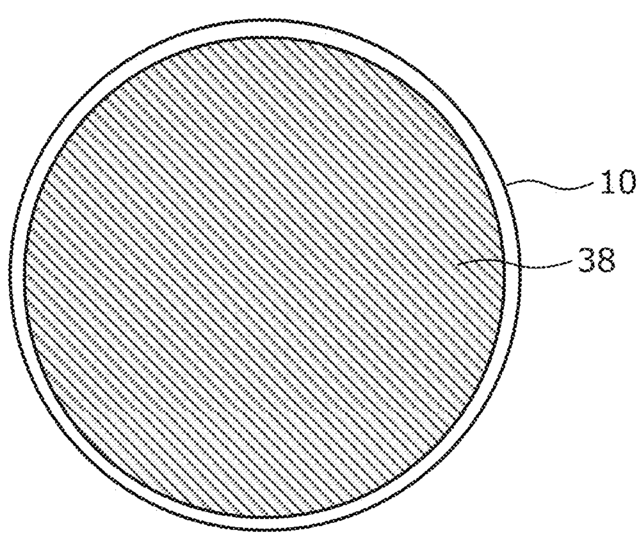
FIG. 11 is a top view schematically depicting a state after resist application in the method of manufacturing the semiconductor device according to the embodiment.

FIG. 11 is a top view schematically depicting a state after resist application in the method of manufacturing the semiconductor device according to the embodiment. As described, in the embodiment, the convex-shaped defect 36 is converted into the concave-shaped defect 35. Thus, for example, when helium defects constituting a lifetime killer are introduced, when a photoresist film 38 is formed as a mask (shielding film), as depicted in FIG. 11, without a wedge-shaped application void due to the convex-shaped defect 36, the photoresist film 38 may be formed in an entire area of the front surface of the semiconductor wafer.

Figure 12:
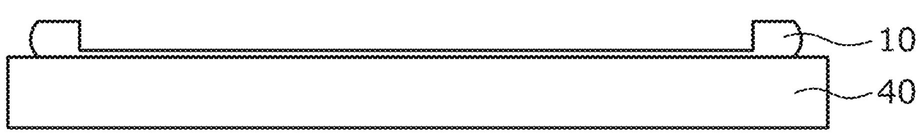
FIG. 12 is a top view schematically depicting a state after attachment to an apparatus stage in the method of manufacturing the semiconductor device according to the embodiment.

Further, FIG. 12 is a top view schematically depicting a state after attachment to the apparatus stage in the method of manufacturing the semiconductor device according to the embodiment. After the semiconductor wafer 10 is ground from the back side thereof, when the front side of the semiconductor wafer 10 is placed on an apparatus stage 40, in the embodiment, the convex-shaped defect 36 is not present and thus, as depicted in FIG. 12, the semiconductor wafer 10 is adhered to the apparatus stage 40 and breakage of the semiconductor wafer 10 may be prevented.

Figure 13:
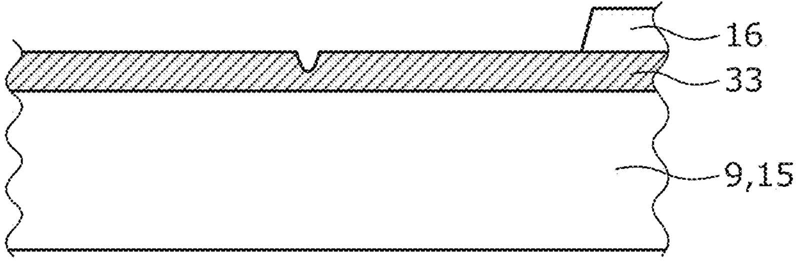
FIG. 13 is a cross-sectional view schematically depicting a state after polyimide film removal in the method of manufacturing the semiconductor device according to the embodiment.

Further, FIG. 13 is a cross-sectional view schematically depicting a state after polyimide film removal in the method of manufacturing the semiconductor device according to the embodiment. In the embodiment, the convex-shaped defect 36 is not present and thus, without formation of an application void during application of a polyimide film 16 and a resist 31, an instance in which the polyimide film 16 cannot be removed may be prevented.

Description of the flowchart depicted in FIG. 2 continues. Next, before the $n^-$-type semiconductor substrate is ground from the back side thereof, a protective resist film (not depicted) is formed on the Al—Si film 33 to protect the surface device structure from becoming damaged (step S8). Next, the semiconductor wafer 10 is ground from the back side thereof (back-grinding) to a position corresponding to a product thickness used for the semiconductor device (step S9). Next, a process including photolithography and ion implantation as one set is repeatedly performed under different conditions, thereby forming the back device structure at the back side of the semiconductor wafer 10 (step S10). For example, the n-type FS layer 12, the $n^+$-type cathode region 14, and the $p^+$-type collector region 13 are formed.

The $n^+$-type cathode region 14 is formed in a surface layer of the semiconductor wafer 10, at the entire ground back surface of the semiconductor wafer 10. The n-type FS layer 12 is formed deeper from the ground back surface of the semiconductor wafer 10 than is the $n^+$-type cathode region 14. The n-type FS layer 12 is formed at least from the IGBT region 21 to the FWD region 22. The n-type FS layer 12 may be in contact with the $n^+$-type cathode region 14.

Next, by photolithography and ion implantation, a portion of the $n^+$-type cathode region 14 corresponding to the IGBT region 21 is converted to a $p^+$-type, thereby forming the $p^+$-type collector region 13. In other words, the $p^+$-type collector region 13 is in contact with the $n^+$-type cathode region 14 in a direction in which the IGBT region 21 and the FWD region 22 are arranged. The $p^+$-type collector region 13 may be in contact with the n-type FS layer 12 in the depth direction.

Next, the $p^+$-type collector region 13 and the n-type FS layer 12 are activated by a heat treatment (annealing). Next, on the front surface of the semiconductor wafer 10, the passivation film is formed so as to cover the edge termination region. Next, the passivation film is patterned, the emitter electrode, the anode electrode, and electrode pads are exposed, Ni—P plating is grown on the emitter electrode and the anode electrode, and Au plating is grown thereon, whereby surface electrodes are formed.

Next, on the front surface of the semiconductor wafer 10, a photoresist film (not depicted) opened at a portion corresponding to the FWD region 22 is formed. Irradiation of helium of a deep range is performed by a high acceleration energy, using the photoresist film as a mask (shielding film), whereby helium defects constituting a lifetime killer are introduced (formed) in the n-type drift region 1 (step S11). Next, the protective resist film formed at step S8 is removed (step S12).

Subsequently, the photoresist film is removed by an ashing treatment (ashing). Next, at the entire back surface of the semiconductor wafer 10, the back electrode 24 is formed (step S13). The back electrode 24 is in contact with the $p^+$-type collector region 13 and the $n^+$-type cathode region 14. The back electrode 24 functions as the collector electrode and functions as the cathode electrode. Subsequently, the semiconductor wafer 10 is cut (diced) into individual chips, whereby the RC-IGBT chip 150 (semiconductor chip) is completed.

As described, according to the embodiment, the resist film is formed thinner than conventionally, whereby a convex-shaped defect may be converted into a concave-shaped defect. As a result, the difference in brightness with the substrate becomes large, whereby detection sensitivity during defect inspection is enhanced and the throughput of the inspection process may be improved. Further, the widths of defects increase due to the etching of the Al—Si film and thus, concave-shaped defects have larger widths than that of convex-shaped defects and the detection sensitivity is enhanced. Furthermore, resist and polyimide application voids at subsequent processes may be improved and when the front side of the semiconductor wafer is placed on the apparatus stage, cracking of the semiconductor wafer may be prevented.

In the foregoing, in the present invention, while an instance in which the MOS gate structure is configured on a first main surface of a silicon substrate is described as an example, without limitation hereto, various modifications such as the semiconductor type (for example, silicon carbide (SiC)), orientation of the main surface of the substrate, etc. are possible. Further, in the embodiment of the present invention, while a trench-type IGBT is described as an example, without limitation hereto, the present invention is applicable to semiconductor devices of various types of configurations such as MOS-type semiconductor devices like metal oxide semiconductor field effect transistors (MOSFETs), planar IGBTs, etc. Further, in the embodiments of the present invention, while a first conductivity type is assumed as an n-type and a second conductivity type is assumed as a p-type, the present invention is similarly implemented when the first conductivity type is a p-type and the second conductivity type is an n-type.

The method of manufacturing a semiconductor device according to the present invention achieves an effect in that a convex-shaped defect is converted into a concave-shaped defect, whereby the percentage of defects may be reduced.

As described, the method of manufacturing a semiconductor device according to the present invention is useful for high-voltage semiconductor devices used in power converting equipment, power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:

forming a surface structure having a metal oxide semiconductor (MOS) structure in a semiconductor substrate;

forming an interlayer insulating film partially covering the surface structure;

forming an aluminum alloy film in contact with the surface structure and covering an entire area where the surface structure, including the interlayer insulating film, is formed;

forming a resist film covering a surface of the aluminum alloy film so as to have a thickness partially exposing a convex-shaped defect on the aluminum alloy film;

patterning the aluminum alloy film using the resist film as a mask; and removing the resist film.

2. The method according to claim 1, wherein the thickness of the resist film is in a range of 1.6 μm to 3.1 μm.

3. The method according to claim 1, wherein the thickness of the resist film is in a range of 2.7 μm to 2.9 μm.

4. The method according to claim 1, wherein the convex-shaped defect has a height of at least 5 μm.

* * * * *